(12) United States Patent
Zeng

(10) Patent No.: US 10,528,860 B2
(45) Date of Patent: Jan. 7, 2020

(54) CARD HOLDER AND ELECTRONIC DEVICE

(71) Applicant: GUANGDONG OPPO MOBILE TELECOMMUNICATIONS CORP., LTD., Dongguan, Guangdong (CN)

(72) Inventor: Yuanqing Zeng, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/927,744

(22) Filed: Mar. 21, 2018

(65) Prior Publication Data
US 2018/0330215 A1 Nov. 15, 2018

(30) Foreign Application Priority Data

May 15, 2017 (CN) .......................... 2017 1 0338862
May 15, 2017 (CN) ...................... 2017 2 0538575 U

(51) Int. Cl.
*H05K 5/02* (2006.01)
*G06K 19/077* (2006.01)
(Continued)

(52) U.S. Cl.
CPC ......... *G06K 19/077* (2013.01); *G06F 1/1658* (2013.01); *G06K 7/0021* (2013.01);
(Continued)

(58) Field of Classification Search
CPC ............... G06K 19/077; G06K 7/0021; G06K 13/0812; G06K 13/0831; G06K 13/0862;
(Continued)

(56) References Cited

U.S. PATENT DOCUMENTS 9,337,575 B1* 5/2016 Chang .................... G06K 13/08
2001/0013483 A1* 8/2001 Konno ................. A45C 11/182
206/706
(Continued)

FOREIGN PATENT DOCUMENTS

CN 103094778 A 5/2013
CN 104065771 A 9/2014
(Continued)

OTHER PUBLICATIONS

Taiwan Patent Application No. 107104485 Office Action dated Nov. 21, 2018, 4 pages.
(Continued)

Primary Examiner — Hoa C Nguyen
Assistant Examiner — Keith DePew
(74) Attorney, Agent, or Firm — Lathrop Gage LLP

(57) ABSTRACT

A card holder is used for an electronic device having a housing, and is able to accommodate a data card and be inserted into the housing. The card holder includes a card tray and a card cover. The card tray is configured to accommodate the data card. The card cover is connected to the card tray, is rotatable relative to the card tray, and includes a first end and a second end opposite to each other and a first protrusion extending towards the card tray. When the card holder is in a state of being inserted into the housing and a pushing force is applied to the first end, the card cover is rotatable about the first protrusion such that the first end extends further into the housing and the second end extends out of the housing. An electronic device is also provided.

19 Claims, 9 Drawing Sheets

(51) Int. Cl.
*G06K 19/00* (2006.01)
*G06K 7/00* (2006.01)
*G06K 13/08* (2006.01)
*G06F 1/16* (2006.01)
*H04M 1/02* (2006.01)
*H05K 5/00* (2006.01)

(52) U.S. Cl.
CPC ..... *G06K 13/0812* (2013.01); *G06K 13/0831* (2013.01); *G06K 13/0862* (2013.01); *G06K 19/005* (2013.01); *H04M 1/026* (2013.01); *H05K 5/0086* (2013.01); *H05K 5/0091* (2013.01); *H05K 5/026* (2013.01)

(58) Field of Classification Search
CPC .... G06K 19/005; G06F 1/1658; H04M 1/026; H05K 5/0086; H05K 5/0091; H05K 5/026
See application file for complete search history.

(56) References Cited

U.S. PATENT DOCUMENTS

| | | | |
|---|---|---|---|
| 2006/0231619 A1 | 10/2006 | Lee | |
| 2012/0134119 A1* | 5/2012 | Tang | G06K 13/0825 361/748 |
| 2012/0311827 A1 | 12/2012 | Wilson | |
| 2013/0115796 A1* | 5/2013 | Liu | G06K 7/0021 439/325 |
| 2014/0198432 A1* | 7/2014 | Huang | H05K 5/0239 361/679.01 |
| 2014/0247568 A1* | 9/2014 | Lin | H04B 1/3818 361/754 |
| 2015/0018041 A1* | 1/2015 | Gorilovsky | G06F 1/1626 455/558 |
| 2015/0022981 A1 | 1/2015 | Tan | |
| 2016/0173155 A1 | 6/2016 | Jiang | |
| 2016/0248184 A1* | 8/2016 | Motohashi | G06K 7/0056 |
| 2016/0359269 A1* | 12/2016 | Motohashi | G06K 7/0021 |

FOREIGN PATENT DOCUMENTS

| | | |
|---|---|---|
| CN | 104253343 A | 12/2014 |
| CN | 104300305 A | 1/2015 |
| CN | 204464626 U | 7/2015 |
| CN | 204793416 U | 11/2015 |
| CN | 105830286 A | 8/2016 |
| CN | 106486840 A | 3/2017 |
| CN | 107171089 A | 9/2017 |
| CN | 206743228 U | 12/2017 |
| EP | 1117066 A1 | 7/2001 |
| TW | 201320498 A | 5/2013 |

OTHER PUBLICATIONS

PCT/CN2017/084344 International Search Report and Written Opinion dated Jan. 25, 2018, 12 pages.
Chinese Patent Application No. 201710338862.9, Office Action dated Aug. 3, 2018, 7 pages.
Chinese Patent Application No. 201710338862.9, English translation of Office Action dated Aug. 3, 2018, 8 pages.
European Patent Application No. 18163157.3, Extended Search and Opinion dated Aug. 28, 2018, 7 pages.
U.S. Appl. No. 16/434,913 Office Action dated Nov. 18, 2019, 18 pages.

* cited by examiner

CARD HOLDER AND ELECTRONIC DEVICE

CROSS-REFERENCE TO RELATED APPLICATION

This application claims priority to and benefits of Chinese Patent Application Serial No. 201720538575.8, filed with the State Intellectual Property Office of P. R. China on May 15, 2017, and Chinese Patent Application Serial No. 201710338862.9, filed with the State Intellectual Property Office of P. R. China on May 15, 2017, the entire content of which are incorporated herein by reference.

FIELD

The present disclosure relates to a technical field of electronic apparatus, and more specifically to a card holder and an electronic device.

BACKGROUND

Generally, a data card can be placed on a card holder, and the card holder is then pushed into an electronic device to achieve an electrical connection between the electronic device and the data card. When a user withdraws the card holder, a card ejector pin is usually used to penetrate a via hole in the card holder and further push out the card holder. However, the card holder is hard to be withdrawn without the card ejector pin.

SUMMARY

The present disclosure provides a card holder and an electronic device.

The card holder of embodiments of the present disclosure is used for the electronic device having a housing, and the card holder is capable of accommodating a data card and is capable of being inserted into the housing. The card holder includes a card tray configured to accommodate the data card and a card cover connected to the card tray. The card cover is rotatable relative to the card tray, and the card cover includes a first end and a second end opposite to each other and a first protrusion extending towards the card tray. When the card holder is in a state of being inserted into the housing and a pushing force is applied to the first end, the card cover is rotatable about the first protrusion such that the first end extends further into the housing and the second end extends out of the housing.

The electronic device of the embodiments of the present disclosure includes a housing defining a card inserting groove and a card holder according to any one of the above embodiments. The card holder is able to extend into the card inserting groove so as to be inserted into the housing.

Additional aspects and advantages of embodiments of the present disclosure will be given in part in the following descriptions, become apparent in part from the following descriptions, or be learned from the practice of the embodiments of the present invention.

BRIEF DESCRIPTION OF THE DRAWINGS

These and other aspects and advantages of embodiments of the present disclosure will become apparent and more readily appreciated from the following descriptions made with reference to the drawings, in which.

Figure 1:
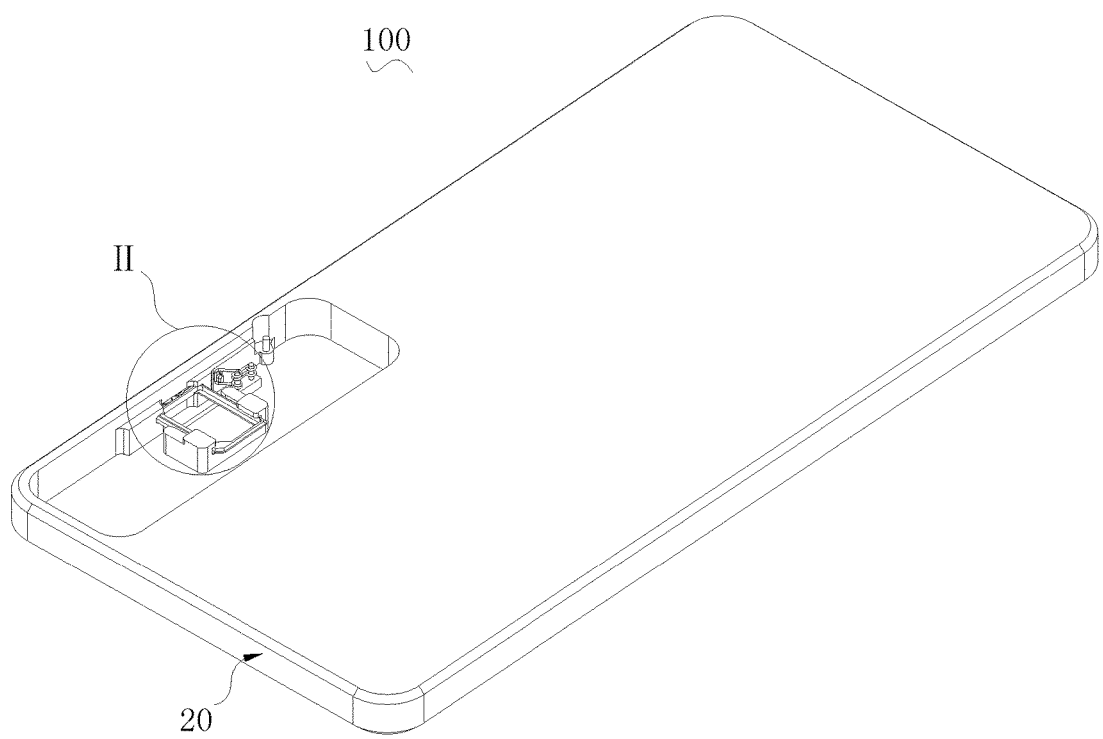
FIG. 1 is a perspective view of an electronic device of an embodiment of the present disclosure.

BRIEF DESCRIPTION OF REFERENCE NUMERALS OF MAIN ELEMENTS electronic device 100, card holder 10, card tray 11, card tray body 112, card slot 1122, connecting plate 114, first sliding slot 1141, first side end 1142, first middle end 1143, second sliding slot 1144, second side end 1145, second middle end 1146, card cover 12, first end 121, first side surface 1212, second end 122, second side surface 1222, first protrusion 123, first shaft hole 1232, second protrusion 124, second shaft hole 1242, accommodating groove 125, sealing member 13, connecting member 14, guiding inclined surface 142, combining member 15, first connecting rod 16, first sliding end 161, first rotating end 162, first upper plate 163, first lower plate 164, first accommodating space 165, first sliding shaft 17, first rotating shaft 18, second connecting rod 19, second sliding end 191, second rotating end 192, second upper plate 193, second lower plate 194, second accommodating space 195, second sliding shaft 1a, second rotating shaft 1b, housing 20, card inserting groove 22, inner wall 222, first inner wall 2222, second inner wall 2224, fixed member 24, card socket 30, guide groove 32, bottom wall 34, top wall 36, top sub-wall 362, side wall 38, clearance space 39, data card 200.

DETAILED DESCRIPTION

Specific embodiments of the present disclosure will be described further with reference to accompanying drawings. The same or similar reference numerals are used to indicate same or similar members or members with same or similar functions throughout the description.

Additionally, the embodiments of the present disclosure described herein with reference to drawings are explanatory, illustrative, and used to generally understand the present disclosure. The embodiments shall not be construed to limit the present disclosure.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature. While a first feature "below," "under," or "on bottom of" a second feature may include an embodiment in which the first feature is right or obliquely "below," "under," or "on bottom of" the second feature, or just means that the first feature is at a height lower than that of the second feature.

The present disclosure relates to a card holder for an electronic device having a housing. The card holder is capable of accommodating a data card and capable of being inserted into the housing, and the card holder includes a card tray configured to accommodate the data card; and a card cover connected to the card tray. The card cover is rotatable relative to the card tray, and includes a first end and a second end opposite to each other and a first protrusion extending towards the card tray; when the card holder is in a state of being inserted into the housing and a pushing force is applied to the first end, the card cover is rotatable about the first protrusion, such that the first end extends further into the housing and the second end extends out of the housing.

In some embodiments, the card tray forms a connecting plate at an end thereof adjacent to the card cover, the card holder further includes a first connecting rod, and the first connecting rod includes a first sliding end slidably connected to the connecting plate; and a first rotating end rotatably connected to the first protrusion; when the card cover is pushed towards or away from the card tray, the first connecting rod can be driven to slide relative to the connecting plate, and/or the first connecting rod can be driven to rotate relative to the first protrusion.

In some embodiments, the connecting plate defines a first sliding slot, the first protrusion defines a first shaft hole, and the card holder further includes a first sliding shaft fixedly connected to the first sliding end and penetrating the first sliding slot, the first sliding end being able to drive the first sliding shaft to slide in the first sliding slot, and the first sliding shaft and the first sliding end being integrally formed or separately formed; and a first rotating shaft penetrating the first rotating end and the first shaft hole, the first rotating end being rotatable about the first rotating shaft.

In some embodiments, the first connecting rod includes a first upper plate and a first lower plate spaced apart from each other, the first upper plate and the first lower plate define a first accommodating space therebetween, and the connecting plate is configured to extend into or out of the first accommodating space when the card cover is pushed towards or away from the card tray.

In some embodiments, the card cover further includes a second protrusion extending towards the card tray, the card holder further includes a second connecting rod, and the second connecting rod includes a second sliding end slidably connected to the connecting plate; and a second rotating end rotatably connected to the second protrusion; when the card cover is pushed towards or away from the card tray, the second connecting rod can be driven to slide relative to the connecting plate, and/or the second connecting rod can be driven to rotate relative to the second protrusion.

In some embodiments, the connecting plate defines a second sliding slot, the second protrusion defines a second shaft hole, and the card holder further includes a second sliding shaft fixedly connected to the second sliding end and penetrating the second sliding slot, the second sliding end being able to drive the second sliding shaft to slide in the second sliding slot, and the second sliding shaft and the second sliding end being integrally formed or separately formed; and a second rotating shaft penetrating the second rotating end and the second shaft hole, the second rotating end being rotatable about the second rotating shaft.

In some embodiments, the second connecting rod includes a second upper plate and a second lower plate spaced apart from each other, the second upper plate and the second lower plate define a second accommodating space therebetween, and the connecting plate is configured to extend into or out of the second accommodating space when the card cover is pushed towards or away from the card tray.

In some embodiments, the card cover defines an accommodating groove at a side thereof adjacent to the card tray, and when the card cover is pushed towards the card tray, the first connecting rod is rotated relative to the first protrusion and finally accommodated in the accommodating groove, and the second connecting rod is rotated relative to the second protrusion and finally accommodated in the accommodating groove.

In some embodiments, a side surface of the first end is a first side surface, the first side surface gradually approaches to a middle position of the card cover in a direction from the card tray to the card cover; a side surface of the second end is a second side surface, and the second side surface is gradually away from the middle position of the card cover in the direction from the card tray to the card cover.

In some embodiments, the card holder further includes a connecting member, the connecting member extends from the second end to the card tray, and the connecting member extends into the housing so as to connect the card cover and the housing when the card holder is in the state of being inserted into the housing.

In some embodiments, the card holder further includes a combining member, the combining member is disposed in the housing, and the connecting member and the combining member are detachably connected so as to connect the card cover and the housing when the card holder is in the state of being inserted into the housing.

In some embodiments, the card holder further includes a sealing member, the sealing member is disposed to a side wall of the card cover, and when the card holder extends into the housing, the sealing member is located between the card cover and the housing and seals a gap between the card cover and the housing.

In some embodiments, a distance from the first end to the first protrusion is less than a distance from the second end to the first protrusion.

The present disclosure further relates to an electronic device. The electronic device includes a housing defining a card inserting groove; and a card carrier capable of accommodating a data card and capable of being inserted into the housing; and the card carrier includes a card tray configured to accommodate the data card, and a card lid connected to the card tray. The card lid is rotatable relative to the card tray, and includes a first end and a second end opposite to each other and a first protrusion extending towards the card tray, when the card carrier is in a state of being inserted into the housing and a pushing force is applied to the first end, the card lid is rotatable about the first protrusion, such that the first end extends further into the housing and the second end extends out of the housing, and the card carrier is able to extend into the card inserting groove so as to be inserted into the housing.

In some embodiments, the card carrier further includes a combining member, the housing further includes a fixed member, the combining member is fixedly disposed to the fixed member, and the combining member is configured to be detachably connected to the card lid when the card carrier is in a state of being inserted into the housing.

In some embodiments, the electronic device further includes a card socket, the card socket is disposed in the housing, the card socket defines a guide groove, and the card tray extends into the guide groove when the card carrier is inserted into the housing.

In some embodiments, the card socket includes a bottom wall, a top wall and a side wall, the bottom wall and the top wall are opposite, the side wall connects the bottom wall and the top wall, and the bottom wall, the top wall and the side wall jointly define the guide groove.

In some embodiments, the card carrier further includes a sealing member, the sealing member is disposed to a side wall of the card lid, and when the card carrier extends into the card inserting groove, the sealing member is located between the card lid and an inner wall of the card inserting groove and seals a gap between the card lid and the inner wall.

In some embodiments, the top wall includes two opposite top sub-walls spaced apart from each other, each of the top sub-walls is connected to the bottom wall through the side wall, and the two top sub-walls define a clearance space therebetween.

In some embodiments, a side surface of the first end is a first side surface, the first side surface gradually approaches to a middle position of the card lid in a direction from the card tray to the card lid; a side surface of the second end is a second side surface, and the second side surface is gradually away from the middle position of the card lid in the direction from the card tray to the card lid; the inner wall of the card inserting groove includes a first inner wall and a second inner wall, when the card carrier is inserted into the card inserting groove, the first inner wall is fitted with the first side surface, and the first inner wall gradually approaches to the middle position of the card inserting groove in a direction from the inside to the outside of the electronic device; the second inner wall is fitted with the second side surface, and the second inner wall is gradually away from the middle position of the card inserting groove in the direction from the inside to the outside of the electronic device.

Figure 2:
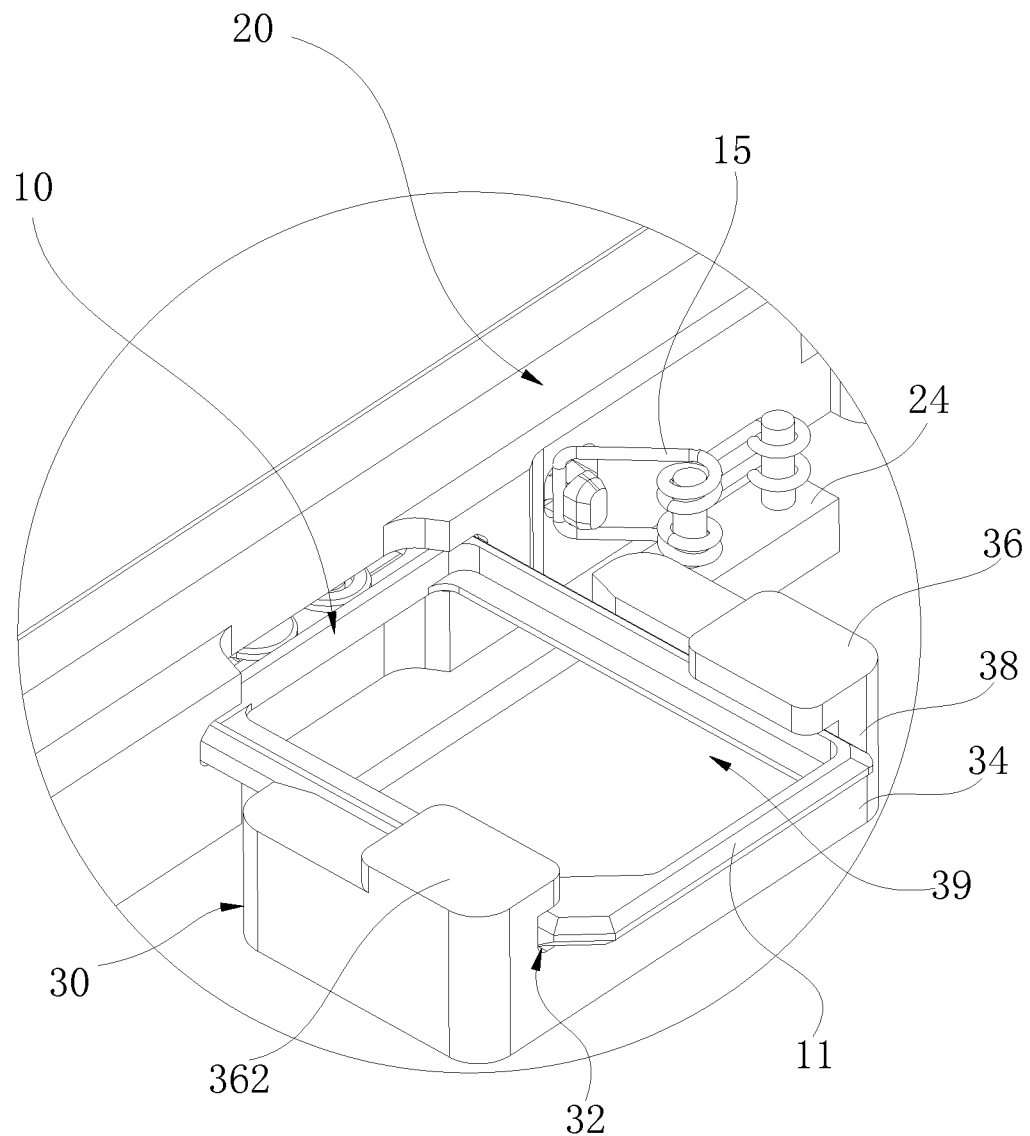
FIG. 2 is an enlarged view of part II of the electronic device in the FIG. 1.
Figure 3:
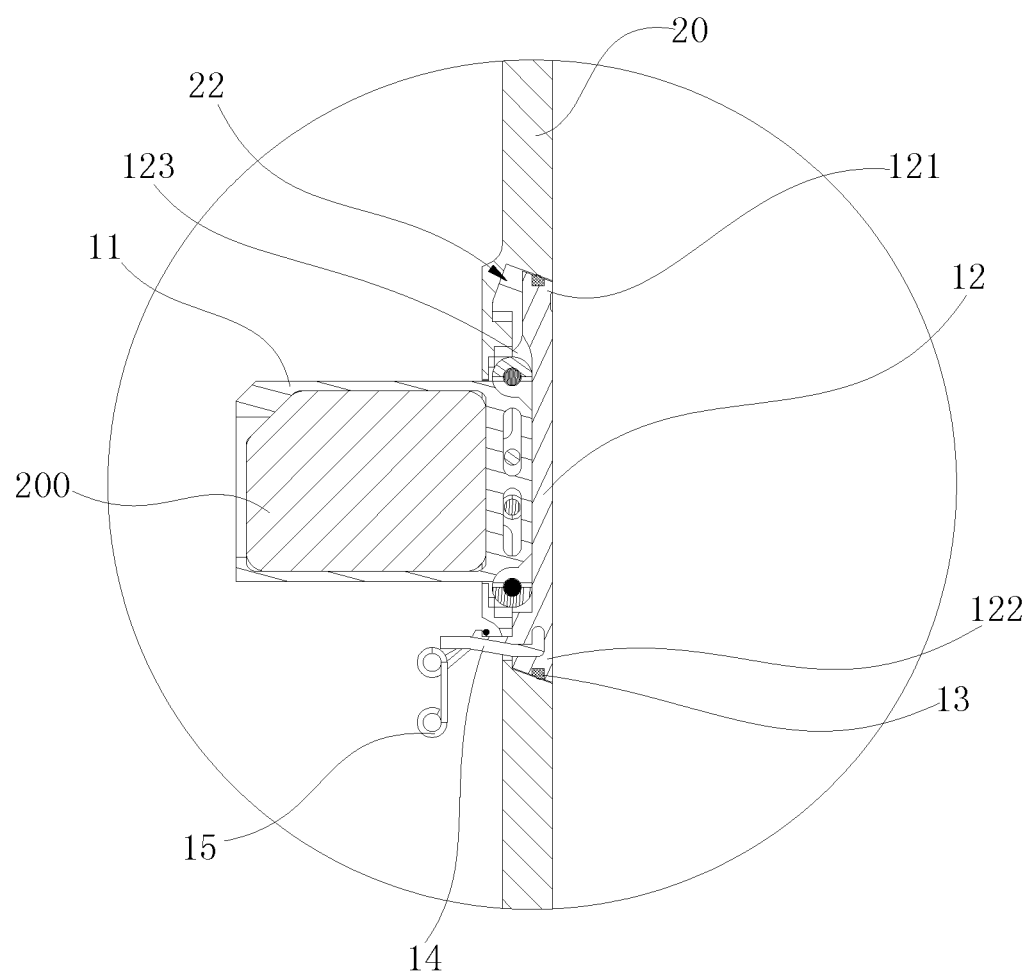
FIG. 3 is an enlarged partial sectional view of a position, corresponding to part II in FIG. 1, of an electronic device of an embodiment of the present disclosure.

Referring to FIGS. 1 to 3, an electronic device 100 according to embodiments of the present disclosure includes a housing 20 and a card holder 10. The housing 20 defines a card inserting groove 22, and the card holder 10 can be extended into the card inserting groove 22 to be inserted into the housing 20.

Figure 4:
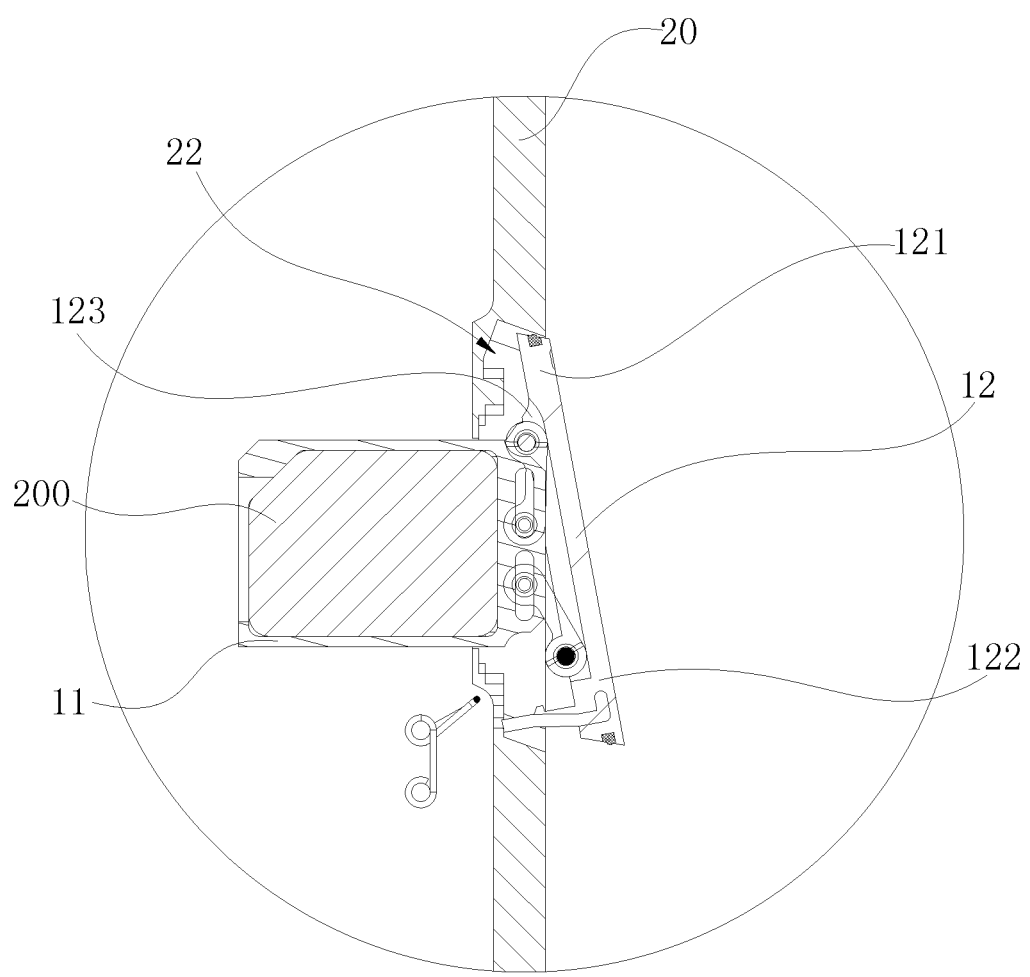
FIG. 4 is an enlarged partial sectional view of a position, corresponding to part II in FIG. 1, of an electronic device of an embodiment of the present disclosure.

In combination with FIGS. 3 to 6, the card holder 10 according to embodiments of the present disclosure can be applied in the electronic device 100 according to embodiments of the present disclosure, and the card holder 10 can accommodate a data card 200 and is capable of being inserted into the housing 20 of the electronic device 100. The card holder 10 includes a card tray 11 and a card cover 12. The card tray 11 is configured to accommodate the data card 200. The card cover 12 is connected to the card tray 11, and the card cover 12 is rotatable relative to the card tray 11. The card cover 12 includes a first end 121 and a second end 122 opposite to each other, and the card cover 12 further includes a first protrusion 123 extending towards the card tray 11. When the card holder 10 is in a state of being inserted into the housing 20 (as illustrated in FIG. 3) and a pushing force is applied to the first end 121, the card cover 12 is rotatable about the first protrusion 123 such that the first end 121 extends further into the housing 20 and the second end 122 extends out of the housing 20 (as illustrated in FIG. 4).

Figure 5:
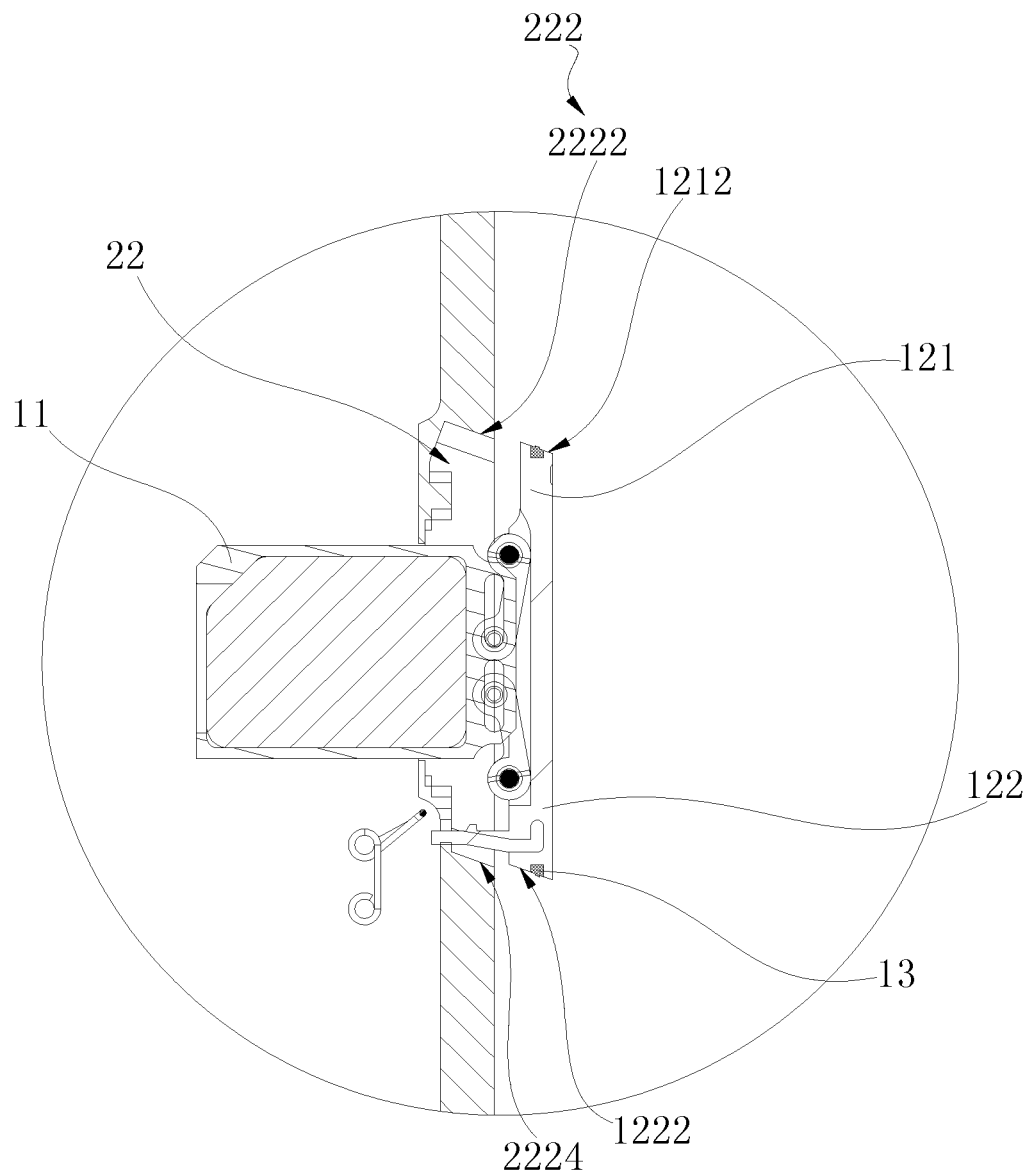
FIG. 5 is an enlarged partial sectional view of a position, corresponding to part II in FIG. 1, of an electronic device of an embodiment of the present disclosure.
Figure 6:
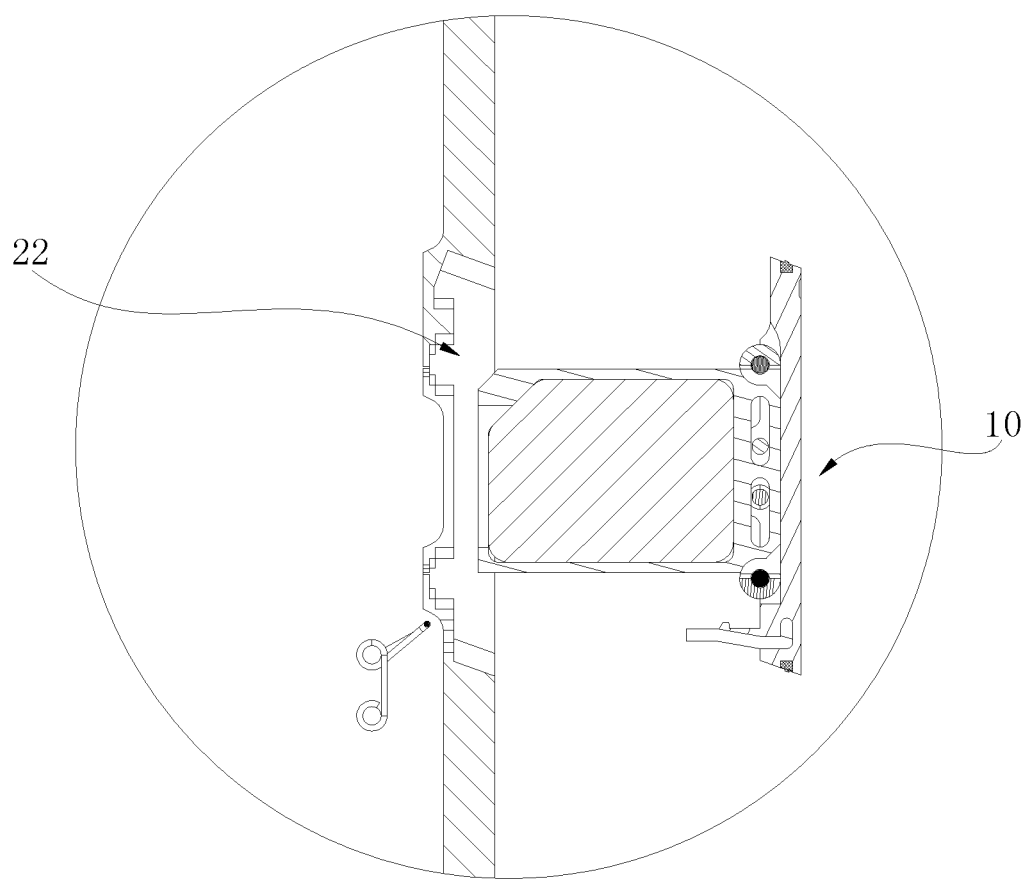
FIG. 6 is an enlarged partial sectional view of a position, corresponding to part II in FIG. 1, of an electronic device of an embodiment of the present disclosure.

Thus, when the card holder 10 needs to be withdrawn from the housing 20, only the first end 121 needs to be pushed such that the card cover 12 can be rotated and the second end 122 can extend out of the housing 20, and the second end 122 can be further pulled to withdraw the whole card holder 10 (as illustrated in FIGS. 5 and 6). Thus, the card holder 10 can be withdrawn from the housing 20 without a card ejector pin, thereby greatly facilitating a user.

Further, when the card holder 10 needs to be inserted into the card inserting groove 22, the card holder 10 is first aligned with the card inserting groove 22 (as illustrated in FIG. 6). The card holder 10 is then gradually inserted into the card inserting groove 22, and specifically, the card tray 11 can be first inserted into the card inserting groove 22 (as illustrated in FIG. 5). The first end 121 is then pushed so that the card cover 12 is rotated about the first protrusion 123, in which case the first end 121 first extends into the card inserting groove 22 while the second end 122 still remains outside the card inserting groove 22 (as illustrated in FIG. 4). Finally, the second end 122 is pushed while holding down the first end 121, so as to push the whole card cover 12 completely into the card inserting groove 22 (as illustrated in FIG. 3).

Specifically, the first protrusion 123 is located at a position adjacent to the first end 121, so that a distance from the first end 121 to the first protrusion 123 is less than a distance from the second end 122 to the first protrusion 123. Based on a lever principle, when the first end 121 is pushed to rotate the card cover 12 about the first protrusion 123, a rotating stroke of the second end 122 is greater than a rotating stroke of the first end 121. Thus, a relatively large part of the second end 122 extends out of the card inserting groove 22, such that the user can grab the second end and withdraw the whole card holder 10 conveniently.

The electronic device 100 may be various devices that can retrieve date from the data card 200 and process the data, or that can import the data into the data card 200. For example, the electronic device 100 may be a mobile phone, a tablet computer, a computing apparatus, an information display apparatus, or the like. The housing 20 may be a frame and an outer casing of the electronic device 100, and the housing 20 is configured to carry and protect an internal element of the electronic device 100.

The data card 200 may be a SIM card, a TF card, a SD card, or the like. The card tray 11 may accommodate one data card 200, and may also accommodate a plurality of data cards 200, such as two data cards 200. The plurality of data cards 200 may be placed in a stacked manner, and may also be placed side by side.

Referring to FIG. 2 again, in some embodiments, the electronic device 100 further includes a card socket 30, the card socket 30 is disposed in the housing 20, the card socket 30 defines a guide groove 32, and the card tray 11 extends into the guide groove 32 when the card holder 10 is inserted into the housing 20.

Figure 7:
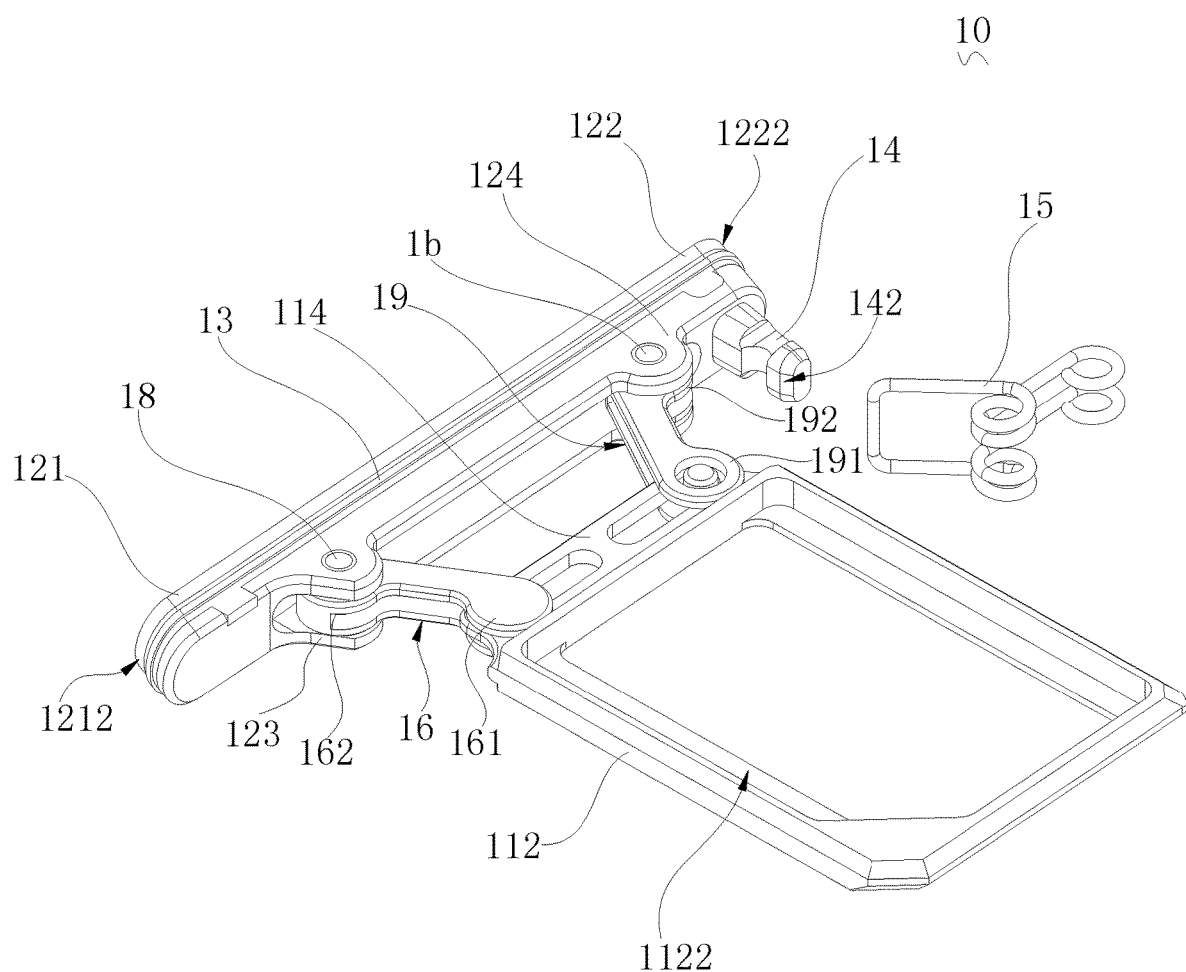
FIG. 7 is a perspective view of a card holder of an embodiment of the present disclosure.

Specifically, further in combination with FIG. 7, the card tray 11 includes a card tray body 112, the card tray body 112 defines a card slot 1122, the data card 200 is placed in the card slot 1122, and a circumferential wall of the card slot 1122 limits movement of the data card 200 in an inserting plane of the card slot 1122. When the card holder 10 is inserted into the housing 20, the card tray body 112 extends into the guide groove 32 and abuts against an inner wall of the guide groove 32, and the card holder 10 is easily inserted into the housing 20 and an inserting direction is easily controlled under a guiding effect of the guide groove 32. An extending direction of the guide groove 32 is the same as a depth direction of the card inserting groove 22, such that the card tray 11 can enter the guide groove 32 conveniently after passing through the card inserting groove 22.

Specifically, in some embodiments, the card socket 30 includes a bottom wall 34, a top wall 36 and a side wall 38. The bottom wall 34 and the top wall 36 are opposite, the side wall 38 connects the bottom wall 34 and the top wall 36, and the bottom wall 34, the top wall 36 and the side wall 38 jointly define the guide groove 32. More specifically, the top wall 36 may include two opposite top sub-walls 362 spaced apart from each other, each of the top sub-walls 362 is connected to the bottom wall 34 through the side wall 38, and the two top sub-walls 362 define a clearance space 39 therebetween, such that a contact terminal of the electronic device 100 (not illustrated) can be electrically connected to the data card 200 conveniently by passing through the clearance space 39.

Referring to FIG. 5 again, in some embodiments, the card holder 10 further includes a sealing member 13, the sealing member 13 is disposed to a side wall of the card cover 12, and the sealing member 13 is located between the card cover 12 and the housing and seals a gap between the card cover 12 and the housing 20 when the card cover 12 extends into the housing 20.

Specifically, the card cover 12 extends into the card inserting groove 22, and the sealing member 13 is located between the card cover 12 and an inner wall 222 of the card inserting groove 22 and seals a gap between the card cover 12 and the inner wall 222. Thus, the sealing member 13 may be configured to prevent moisture and dust from entering the electronic device 100 via the gap between the card cover 12 and the inner wall 222. Additionally, friction forces can be generated between the sealing member 13 and the card cover 12 and between the sealing member 13 and the inner wall 222, and the friction forces prevent the card holder 10 from sliding out of and falling off the card inserting groove 22 by itself under vibration. In embodiments of the present disclosure, the sealing member 13 is in a continuous ring shape and fitted over the card cover 12, and the sealing member 13 may be made of materials such as silica gel, rubber, and so on.

In some embodiments, a side surface of the first end 121 is a first side surface 1212, and the first side surface 1212 gradually approaches to a middle position of the card cover 12 in a direction from the card tray 11 to the card cover 12. A side surface of the second end 122 is a second side surface 1222, and the second side surface 1222 is gradually away from the middle position of the card cover 12 in the direction from the card tray 11 to the card cover 12.

Correspondingly, the inner wall 222 of the card inserting groove 22 includes a first inner wall 2222 and a second inner wall 2224. When the card holder 10 is inserted into the card inserting groove 22, the first inner wall 2222 is fitted with the first side surface 1212, and the first inner wall 2222 gradually approaches to the middle position of the card inserting groove 22 in a direction from the inside to the outside of the electronic device 100; the second inner wall 2224 is fitted with the second side surface 1222, and the second inner wall 2224 is gradually away from the middle position of the card inserting groove 22 in the direction from the inside to the outside of the electronic device 100.

Thus, when the first end 121 is pushed to rotate the card cover 12 about the first protrusion 123, the first end 121 and the second end 122 will not interfere with the inner wall 222 of the card inserting groove 22, such that the card cover 12 can enter the card inserting groove 22.

In combination with FIGS. 2 and 3, in some embodiments, the card holder 10 further includes a connecting member 14, the connecting member 14 extends from the second end 122 towards the card tray 11, and the connecting member 14 extends into the housing 20 so as to connect the card cover 12 and the housing 20 when the card holder 10 is in the state of being inserted into the housing 20. Further, in some embodiments, the card holder 10 further includes a combining member 15, the combining member 15 is disposed in the housing 20, and the connecting member 14 and the combining member 15 are detachably connected to connect the card cover 12 and the housing 20 when the card holder 10 is in the state of being inserted into the housing 20.

Specifically, specific structures of the connecting member 14 and the combining member 15 may have various selections. In combination with FIG. 7, in embodiments of the present disclosure, the connecting member 14 is a hook, the combining member 15 is a buckle, an end portion of the connecting member 14 forms a guiding inclined surface 142, the combining member 15 abuts against the guiding inclined surface 142 when the connecting member 14 gradually extends into the housing 20 and contacts the combining member 15, and the connecting member 14 are snapped with the combining member 15 when the connecting member 14 is further pushed in. When the card holder 10 needs to be withdrawn, the connecting member 14 is separated from the combining member 15 under a pulling action of the second end 122.

Further, in some embodiments, in combination with FIG. 2, the housing 20 further includes a fixed member 24, and the combining member 15 is fixedly disposed to the fixed member 24. In embodiments of the present disclosure, the combining member 15 is wound around the fixed member 24, such that an end of the combining member 15 fitted with the connecting member 14 has a high degree of freedom so as to achieve a detachable fitting between the connecting member 14 and the combining member 15.

Figure 8:
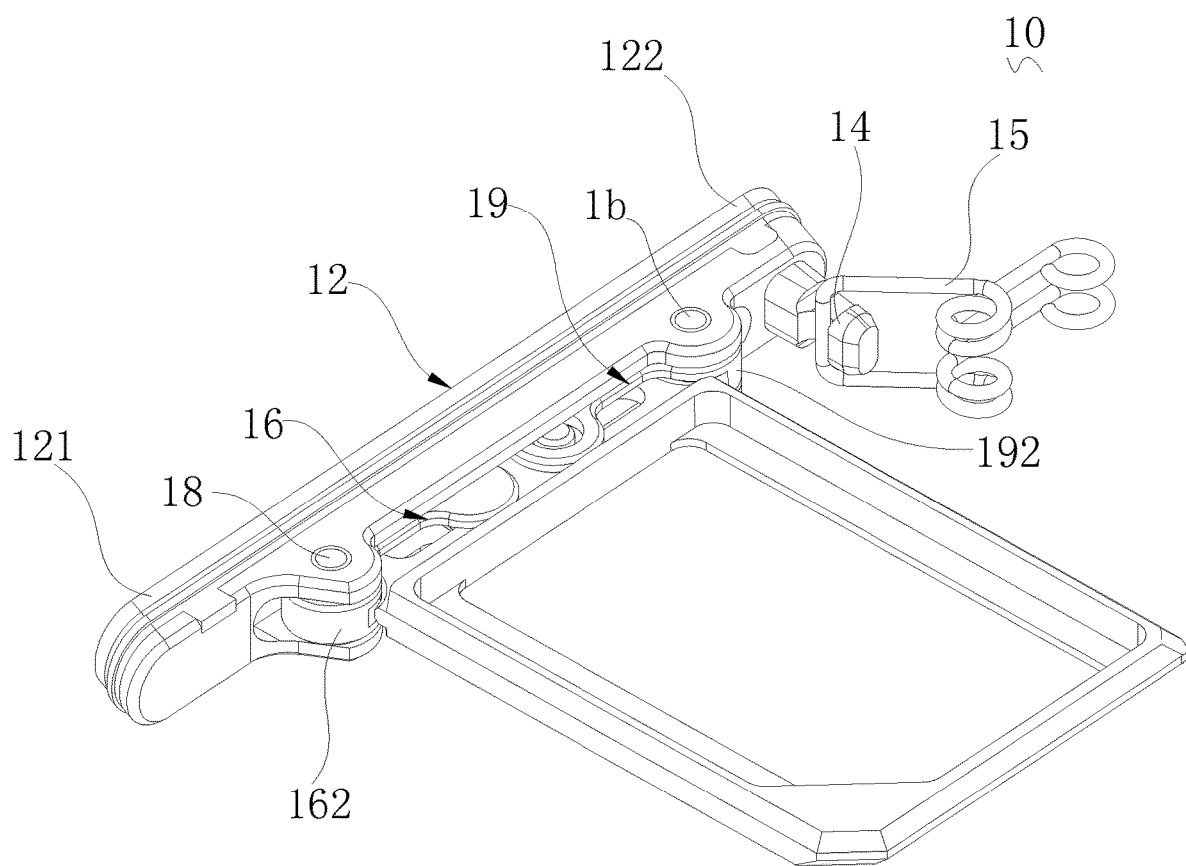
FIG. 8 is a perspective view of a card holder of an embodiment of the present disclosure.
Figure 9:
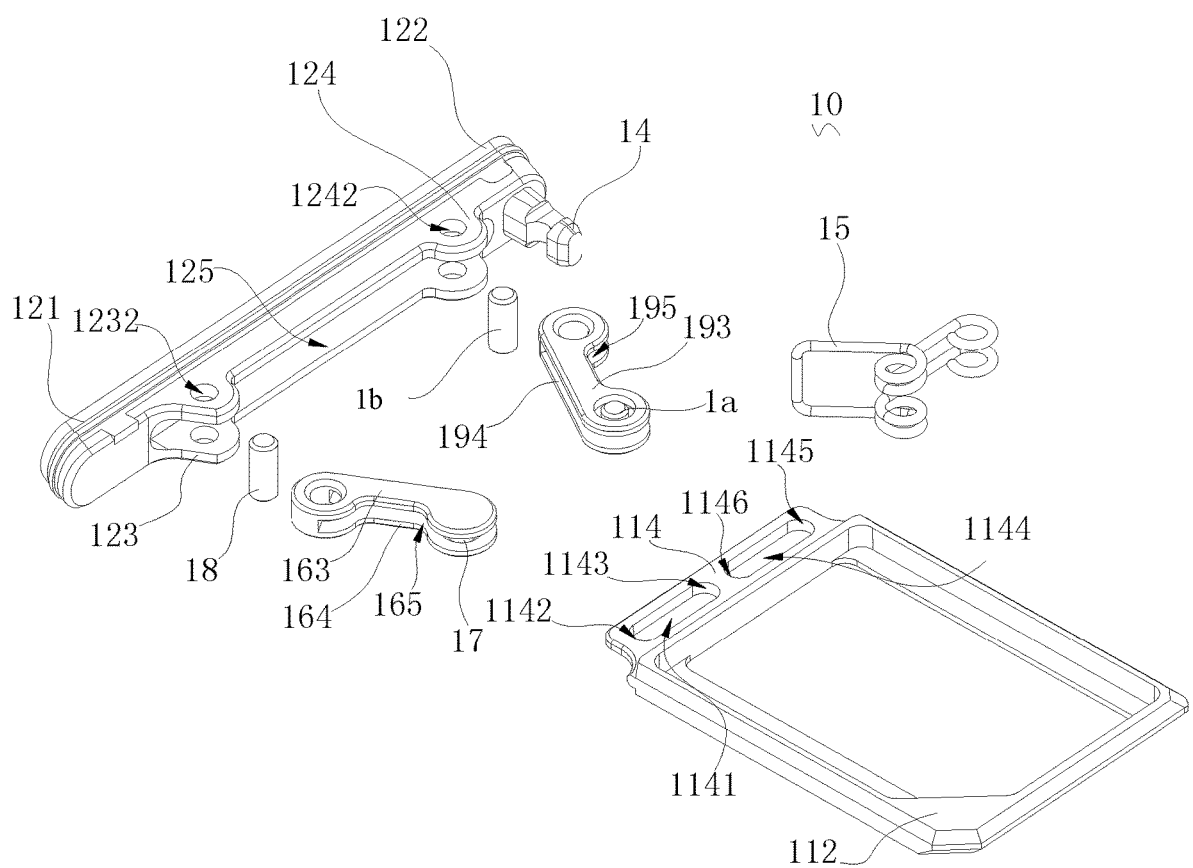
FIG. 9 is an exploded perspective view of a card holder of an embodiment of the present disclosure.

Referring to FIGS. 7 to 9, in some embodiments, an end of the card tray 11 adjacent to the card cover 12 forms a connecting plate 114, the card holder 10 further includes a first connecting rod 16, and the first connecting rod 16 includes a first sliding end 161 and a first rotating end 162. The first sliding end 161 is slidably connected to the connecting plate 114, and the first rotating end 162 is rotatably connected to the first protrusion 123. When the card cover 12 is pushed towards or away from the card tray 11, the first connecting rod 16 can be driven to slide relative to the connecting plate 114, and/or the first connecting rod 16 can be driven to rotate relative to the first protrusion 123. That is to say, in a situation, when the card cover 12 is pushed towards or away from the card tray 11, the first connecting rod 16 can be driven to merely slide relative to the connecting plate 114; in another situation, when the card cover 12 is pushed towards or away from the card tray 11, the first connecting rod 16 can be driven to merely rotate relative to the first protrusion 123; and in a further situation, when the card cover 12 is pushed towards or away from the card tray 11, the first connecting rod 16 can be driven to slide relative to the connecting plate 114 and rotate relative to the first protrusion 123 simultaneously.

Thus, the card tray 11 is movably connected to the card cover 12, a relative position between the card tray 11 and the card cover 12 is adjustable by adjusting a position of the first sliding end 161 or by adjusting an angle of the first rotating end 162. Specifically, when the card holder 10 needs to be withdrawn from the housing 20, by pulling the second end 122 that extends out of the card inserting groove 22, the first connecting rod 16 can be driven to move so as to make a distance between the card cover 12 and the card tray 11 relatively large, such that the user can grab the card cover 12 or grad the card cover 12 and the first connecting rod 16 simultaneously conveniently to further withdraw the card tray 11.

It should be understood that motion states of the first connecting rod 16 includes a motion state that the first sliding end 161 slides relative to connecting plate 114 and the first rotating end 162 is stationary relative to the first protrusion 123; a motion state that the first rotating end 162 rotates relative to the first protrusion 123 and the first sliding end 161 is stationary relative to the connecting plate 114; and a motion state that the first rotating end 162 rotates relative to the first protrusion 123 and the first sliding end 161 slides relative to the connecting plate 114. Thus, the relative position relation of the card cover 12 and the card tray 11 may be more diversified, such that the user can perform various operations on the card holder 10 conveniently.

Specifically, in some embodiments, the connecting plate 114 defines a first sliding slot 1141, the first protrusion 123 defines a first shaft hole 1232, and the card holder 10 further includes a first sliding shaft 17 and a first rotating shaft 18. The first sliding shaft 17 is fixedly connected to the first sliding end 161 and penetrates the first sliding slot 1141, the first sliding end 161 can drive the first sliding shaft 17 to slide in the first sliding slot 1141, and the first sliding shaft 17 and the first sliding end 161 are integrally formed or separately formed. The first rotating shaft 18 penetrates the first rotating end 162 and the first shaft hole 1232, and the first rotating end 162 is rotatable about the first rotating shaft 18.

Thus, a connection structure of the card tray 11, the card cover 12 and the first connecting rod 16 is simple and easy to assemble and disassemble. An extending direction of the first sliding slot 1141 may be perpendicular to a direction in which the card holder 10 is inserted into the housing 20, the first sliding slot 1141 includes a first side end 1142 and a first middle end 1143, the first side end 1142 is closer to the first protrusion 123 than the first middle end 1143, and the first sliding shaft 17 slides between the first side end 1142 and the first middle end 1143.

In some embodiments, the first connecting rod 16 includes a first upper plate 163 and a first lower plate 164 spaced apart from each other, and the first upper plate 163 and the first lower plate 164 define a first accommodating space 165 therebetween. The connecting plate 114 extends into or out of the first accommodating space 165 when the card cover 12 is pushed towards or away from the card tray 11.

Thus, the connecting plate 114 can extend into the first accommodating space 165, and the connecting plate 114 will not interfere with the first connecting rod 16, thereby further improving the degree of freedom of the first connecting rod 16. Specifically, when the connecting plate 114 extends into the first accommodating space 165, the first sliding shaft 17 is located at a position of the first middle end 1143, and the first rotating end 162 rotates such that the first connecting rod 16 is wholly located at a position relatively close to the card cover 12. In this case, the card cover 12, the first connecting rod 16 and the card tray 11 are relatively compact (as illustrated in FIG. 8).

Referring to FIGS. 7 to 9 again, in some embodiments, the card cover 12 further includes a second protrusion 124 extending towards the card tray 11. The card holder 10 further includes a second connecting rod 19, and the second connecting rod 19 includes a second sliding end 191 and a second rotating end 192. The second sliding end 191 is slidably connected to the connecting plate 114. The second rotating end 192 is rotatably connected to the second protrusion 124. When the card cover 12 is pushed towards or away from the card tray 11, the second connecting rod 19 can be driven to slide relative to the connecting plate 114, and/or the second connecting rod 19 can be driven to rotate relative to the second protrusion 124. That is to say, in a situation, when the card cover 12 is pushed towards or away from the card tray 11, the second connecting rod 19 can be driven to merely slide relative to the connecting plate 114; in another situation, when the card cover 12 is pushed towards or away from the card tray 11, the second connecting rod 19 can be driven to merely rotate relative to the second protrusion 124; and in a further situation, when the card cover 12 is pushed towards or away from the card tray 11, the second connecting rod 19 can be driven to slide relative to the connecting plate 114 and rotate relative to the second protrusion 124 simultaneously.

Specifically, the second protrusion 124 is disposed adjacent to the second end 122, a distance between the second protrusion 124 and the second end 122 may be equal to a distance between the first protrusion 123 and the first end 121, a protruding height of the second protrusion 124 may be equal to a protruding height of the first protrusion 123, and a shape of the second connecting rod 19 may be the same as a shape of the first connecting rod 16.

Thus, when the card cover 12 is pulled, the card cover 12 can act on the card tray 11 through the first connecting rod 16 and the second connecting rod 19 simultaneously, and it is easier to control the direction in which the card tray 11 is pulled or pushed, compared to the situation that only the first connecting rod 16 is provided. It should be understood that motion states of the second connecting rod 19 includes a motion state that the second sliding end 191 slides relative to connecting plate 114 and the second rotating end 192 is stationary relative to the second protrusion 124; a motion state that the second rotating end 192 rotates relative to the second protrusion 124 and the second sliding end 191 is stationary relative to the connecting plate 114; and a motion state that the second rotating end 192 rotates relative to the second protrusion 124 and the second sliding end 191 slides relative to the connecting plate 114. Thus, the relative position relation of the card cover 12 and the card tray 11 may be more diversified, such that the user can performs various operations on the card holder 10 conveniently.

Specifically, in some embodiments, the connecting plate 114 defines a second sliding slot 1144, and the second protrusion 124 defines a second shaft hole 1242. The card holder 10 further includes a second sliding shaft 1a and a second rotating shaft 1b. The second sliding shaft 1a is fixedly connected to the second sliding end 191 and penetrates the second sliding slot 1144, the second sliding end 191 can drive the second sliding shaft 1a to slide in the second sliding slot 1144, and the second sliding shaft 1a and the second sliding end 191 are integrally formed or separately formed. The second rotating shaft 1b penetrates the second rotating end 192 and the second shaft hole 1242, and the second rotating end 192 is rotatable about the second rotating shaft 1b.

Thus, a connection structure of the card tray 11, the card cover 12 and the second connecting rod 19 is simple and easy to assemble and disassemble. An extending direction of the second sliding slot 1144 may be perpendicular to the direction in which the card holder 10 is inserted into the housing 20, the second sliding slot 1144 includes a second side end 1145 and a second middle end 1146, the second side end 1145 is closer to the second protrusion 124 than the second middle end 1146, and the second sliding shaft 1*a* slides between the second side end 1145 and the second middle end 1146. An extending direction of the second sliding slot 1144 is the same as the extending direction of the first sliding slot 1141.

In some embodiments, the second connecting rod 19 includes a second upper plate 193 and a second lower plate 194 spaced apart from each other, and the second upper plate 193 and the second lower plate 194 define a second accommodating space 195 therebetween. The connecting plate 114 extends into or out of the second accommodating space 195 when the card cover 12 is pushed towards or away from the card tray 11.

Thus, the connecting plate 114 can extend into the second accommodating space 195, and the connecting plate 114 will not interfere with the second connecting rod 19, thereby further improving the degree of freedom of the second connecting rod 19. Specifically, while the connecting plate 114 extends into the first accommodating space 165, the connecting plate 114 extends into the second accommodating space 195. In this case, the first sliding shaft 17 is located at the position of the first middle end 1143, and the first rotating end 162 rotates such that the first connecting rod 16 is wholly located at the position relatively close to the card cover 12, the second sliding shaft 1*a* is located at a position of the second middle end 1146, and the second rotating end 192 rotates such that the second connecting rod 19 is wholly located at a position relatively close to the card cover 12. In this case, the card cover 12, the first connecting rod 16, the second connecting rod 19 and the card tray 11 are relatively compact (as illustrated in FIG. 8).

In some embodiments, the card cover 12 defines an accommodating groove 125 at a side thereof adjacent to the card tray 11, and when the card cover 12 is pushed towards the card tray 11, the first connecting rod 16 rotates relative to the first protrusion 123 and is finally accommodated in the accommodating groove 125, and the second connecting rod 19 rotates relative to the second protrusion 124 and is finally accommodated in the accommodating groove 125.

Thus, the first connecting rod 16 and the second connecting rod 19 can be accommodated in the accommodating groove 125, making the structure of the card holder 10 compact. Further, when the first connecting rod 16 and the second connecting rod 19 are accommodated in the accommodating groove 125, the connecting plate 114 extends into the first accommodating space 165 and the second accommodating space 195, such that the card cover 12, the first connecting rod/the second connecting rod 19, and the connecting plate 114 are disposed in a stacked manner, thereby reducing a horizontal space occupied by the first connecting rod 16, the second connecting rod 19 and the connecting plate 114.

Specifically, the accommodating groove 125 penetrates the first protrusion 123 and the second protrusion 124 to divide the first protrusion 123 and the second protrusion 124 into upper and lower parts separately, the first rotating end 162 is disposed between the upper and lower parts of the first protrusion 123, and the second rotating end 192 is disposed between the upper and lower parts of the second protrusion 124.

Reference throughout this specification to "an embodiment," "some embodiments," "an illustrative embodiment" "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples.

In addition, terms such as "first" and "second" are used herein for purposes of description and are not intended to indicate or imply relative importance or significance. Thus, the feature defined with "first" and "second" may comprise one or more of this feature. In the description of the present disclosure, the term "a plurality of" means two or more than two, unless specified otherwise.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure. The scope of the present disclosure is limited by the claims and its equivalence.

What is claimed is:

1. A card holder for an electronic device having a housing, the card holder being capable of accommodating a data card and being capable of being inserted into the housing, and the card holder comprising:
 a card tray configured to accommodate the data card; and
 a card cover connected to the card tray, the card cover being rotatable relative to the card tray, the card cover comprising a first end and a second end opposite to each other and a first protrusion extending towards the card tray;
 when the card holder is in a state of being inserted into the housing and a pushing force is applied to the first end, the card cover being rotatable about the first protrusion, such that the first end extends further into the housing and the second end extends out of the housing,
 wherein the card tray forms a connecting plate at an end thereof adjacent to the card cover, the card holder further comprises a first connecting rod, and the first connecting rod comprises:
 a first sliding end slidably connected to the connecting plate; and
 a first rotating end rotatably connected to the first protrusion;
 when the card cover is pushed towards or away from the card tray, the first connecting rod can be driven to slide relative to the connecting plate, and/or the first connecting rod can be driven to rotate relative to the first protrusion.

2. The card holder according to claim 1, wherein the connecting plate defines a first sliding slot, the first protrusion defines a first shaft hole, and the card holder further comprises:
 a first sliding shaft fixedly connected to the first sliding end and penetrating the first sliding slot, the first sliding end being able to drive the first sliding shaft to slide in the first sliding slot, and the first sliding shaft and the first sliding end being integrally formed or separately formed; and
 a first rotating shaft penetrating the first rotating end and the first shaft hole, the first rotating end being rotatable about the first rotating shaft.

3. The card holder according to claim 1, wherein the first connecting rod comprises a first upper plate and a first lower plate spaced apart from each other, the first upper plate and the first lower plate define a first accommodating space therebetween, and the connecting plate is configured to extend into or out of the first accommodating space when the card cover is pushed towards or away from the card tray.

4. The card holder according to claim 1, wherein the card cover further comprises a second protrusion extending towards the card tray, the card holder further comprises a second connecting rod, and the second connecting rod comprises:
- a second sliding end slidably connected to the connecting plate; and
- a second rotating end rotatably connected to the second protrusion;
- when the card cover is pushed towards or away from the card tray, the second connecting rod can be driven to slide relative to the connecting plate, and/or the second connecting rod can be driven to rotate relative to the second protrusion.

5. The card holder according to claim 4, wherein the connecting plate defines a second sliding slot, the second protrusion defines a second shaft hole, and the card holder further comprises:
- a second sliding shaft fixedly connected to the second sliding end and penetrating the second sliding slot, the second sliding end being able to drive the second sliding shaft to slide in the second sliding slot, and the second sliding shaft and the second sliding end being integrally formed or separately formed; and
- a second rotating shaft penetrating the second rotating end and the second shaft hole, the second rotating end being rotatable about the second rotating shaft.

6. The card holder according to claim 4, wherein the second connecting rod comprises a second upper plate and a second lower plate spaced apart from each other, the second upper plate and the second lower plate define a second accommodating space therebetween, and the connecting plate is configured to extend into or out of the second accommodating space when the card cover is pushed towards or away from the card tray.

7. The card holder according to claim 4, wherein the card cover defines an accommodating groove at a side thereof adjacent to the card tray, and when the card cover is pushed towards the card tray, the first connecting rod is rotated relative to the first protrusion and finally accommodated in the accommodating groove, and the second connecting rod is rotated relative to the second protrusion and finally accommodated in the accommodating groove.

8. The card holder according to claim 1, wherein a side surface of the first end is a first side surface, the first side surface gradually approaches to a middle position of the card cover in a direction from the card tray to the card cover; a side surface of the second end is a second side surface, and the second side surface is gradually away from the middle position of the card cover in the direction from the card tray to the card cover.

9. The card holder according to claim 1, wherein the card holder further comprises a connecting member, the connecting member extends from the second end to the card tray, and the connecting member extends into the housing so as to connect the card cover and the housing when the card holder is in the state of being inserted into the housing.

10. The card holder according to claim 9, wherein the card holder further comprises a combining member, the combining member is disposed in the housing, and the connecting member and the combining member are detachably connected so as to connect the card cover and the housing when the card holder is in the state of being inserted into the housing.

11. The card holder according to claim 1, wherein the card holder further comprises a sealing member, the sealing member is disposed to a side wall of the card cover, and when the card holder extends into the housing, the sealing member is located between the card cover and the housing and seals a gap between the card cover and the housing.

12. The card holder according to claim 1, wherein a distance from the first end to the first protrusion is less than a distance from the second end to the first protrusion.

13. An electronic device, comprising:
- a housing defining a card inserting groove; and
- a card carrier capable of accommodating a data card and capable of being inserted into the housing, and the card carrier comprising:
  - a card tray configured to accommodate the data card, and
  - a card lid connected to the card tray, the card lid being rotatable relative to the card tray, the card lid comprising a first end and a second end opposite to each other and a first protrusion extending towards the card tray,
  - when the card carrier is in a state of being inserted into the housing and a pushing force is applied to the first end, the card lid being rotatable about the first protrusion, such that the first end extends further into the housing and the second end extends out of the housing,
- and the card carrier being able to extend into the card inserting groove so as to be inserted into the housing,
- wherein the card tray forms a connecting plate at an end thereof adjacent to the card cover, the card holder further comprises a first connecting rod, and the first connecting rod comprises:
  - a first sliding end slidably connected to the connecting plate; and
  - a first rotating end rotatably connected to the first protrusion;
  - when the card cover is pushed towards or away from the card tray, the first connecting rod can be driven to slide relative to the connecting plate, and/or the first connecting rod can be driven to rotate relative to the first protrusion.

14. The electronic device according to claim 13, wherein the card carrier further comprises a combining member, the housing further comprises a fixed member, the combining member is fixedly disposed to the fixed member, and the combining member is configured to be detachably connected to the card lid when the card carrier is in a state of being inserted into the housing.

15. The electronic device according to claim 13, wherein the electronic device further comprises a card socket, the card socket is disposed in the housing, the card socket defines a guide groove, and the card tray extends into the guide groove when the card carrier is inserted into the housing.

16. The electronic device according to claim 15, wherein the card socket comprises a bottom wall, a top wall and a side wall, the bottom wall and the top wall are opposite, the side wall connects the bottom wall and the top wall, and the bottom wall, the top wall and the side wall jointly define the guide groove.

17. The electronic device according to claim 16, wherein the top wall comprises two opposite top sub-walls spaced apart from each other, each of the top sub-walls is connected to the bottom wall through the side wall, and the two top sub-walls define a clearance space therebetween.

18. The electronic device according to claim 13, wherein the card carrier further comprises a sealing member, the sealing member is disposed to a side wall of the card lid, and when the card carrier extends into the card inserting groove, the sealing member is located between the card lid and an inner wall of the card inserting groove and seals a gap between the card lid and the inner wall.

19. The electronic device according to claim 18, wherein a side surface of the first end is a first side surface, the first side surface gradually approaches to a middle position of the card lid in a direction from the card tray to the card lid; a side surface of the second end is a second side surface, and the second side surface is gradually away from the middle position of the card lid in the direction from the card tray to the card lid; the inner wall of the card inserting groove comprises a first inner wall and a second inner wall, when the card carrier is inserted into the card inserting groove, the first inner wall is fitted with the first side surface, and the first inner wall gradually approaches to the middle position of the card inserting groove in a direction from the inside to the outside of the electronic device; the second inner wall is fitted with the second side surface, and the second inner wall is gradually away from the middle position of the card inserting groove in the direction from the inside to the outside of the electronic device.

* * * * *